(12) United States Patent
Zalar et al.

(10) Patent No.: US 10,991,764 B2
(45) Date of Patent: Apr. 27, 2021

(54) PHOTODETECTOR ARRAY

(71) Applicant: SIGNTLE INC., Tokyo (JP)

(72) Inventors: Peter Zalar, Tokyo (JP); Naoji Matsuhisa, Tokyo (JP); Takao Someya, Tokyo (JP)

(73) Assignee: SIGNTLE INC., Tokyo (JP)

( * ) Notice: Subject to any disclaimer, the term of this patent is extended or adjusted under 35 U.S.C. 154(b) by 0 days.

(21) Appl. No.: 16/476,753

(22) PCT Filed: Jan. 11, 2018

(86) PCT No.: PCT/JP2018/000448
§ 371 (c)(1),
(2) Date: Jul. 9, 2019

(87) PCT Pub. No.: WO2018/131638
PCT Pub. Date: Jul. 19, 2018

(65) Prior Publication Data
US 2019/0378880 A1    Dec. 12, 2019

(30) Foreign Application Priority Data
Jan. 15, 2017  (JP) .............................. JP2017-004745

(51) Int. Cl.
*H01L 27/30* (2006.01)
*H01L 51/42* (2006.01)
(Continued)

(52) U.S. Cl.
CPC .......... *H01L 27/307* (2013.01); *H01L 51/004* (2013.01); *H01L 51/0035* (2013.01);
(Continued)

(58) Field of Classification Search
None
See application file for complete search history.

(56) References Cited

U.S. PATENT DOCUMENTS

| 4,644,406 A | 2/1987 | Nishigaki et al. |
| 4,758,734 A | 7/1988 | Uchida et al. |
| (Continued) | | |

FOREIGN PATENT DOCUMENTS

| JP | 60-161664 A | 8/1985 |
| JP | 61-203668 A | 9/1986 |
| (Continued) | | |

OTHER PUBLICATIONS

International Search Report for PCT/JP2018/000448 (PCT/ISA/210) dated Mar. 13, 2018.
(Continued)

*Primary Examiner* — Robert K Carpenter
(74) *Attorney, Agent, or Firm* — Birch, Stewart, Kolasch & Birch, LLP

(57) ABSTRACT

A photodetector array of a stacked film comprises, a plurality of first electrodes formed on a substrate and extending in parallel in a first direction, a plurality of second electrodes extending in parallel in a second direction crossing the first electrodes, a first organic thin film diode and a second organic thin film diode disposed between each of the first electrodes and each of the second electrodes, and an intermediate connection electrode layer serving as a common anode or a common cathode. The intermediate connection electrode layer connects the first organic thin film diode and the second organic thin film diode by backward-diode connection. At least either the first electrodes or the second electrodes are transparent with light passing therethrough, the first organic thin film diode is a photoresponsive organic diode, and the second organic thin film diode is an organic rectifier diode.

14 Claims, 11 Drawing Sheets

(51) Int. Cl.
  *H01L 51/05* (2006.01)
  *H01L 51/00* (2006.01)
  *H04N 1/028* (2006.01)
  *H04N 5/369* (2011.01)
(52) U.S. Cl.
  CPC ...... *H01L 51/0097* (2013.01); *H01L 51/0579* (2013.01); *H01L 51/4253* (2013.01); *H04N 1/02805* (2013.01); H01L 51/0036 (2013.01); H01L 51/0037 (2013.01); H01L 51/0047 (2013.01); H04N 5/379 (2018.08)

(56) References Cited

U.S. PATENT DOCUMENTS

| | | | |
|---|---|---|---|
| 6,441,395 B1 * | 8/2002 | Yu | H01L 27/14609 257/40 |
| 2004/0016886 A1 | 1/2004 | Ringermacher et al. | |
| 2005/0217722 A1 | 10/2005 | Komatsu et al. | |
| 2014/0191218 A1 | 7/2014 | Katz et al. | |

FOREIGN PATENT DOCUMENTS

| | | |
|---|---|---|
| JP | 2002-502128 A | 1/2002 |
| JP | 2004-64087 A | 2/2004 |
| JP | 2006-261172 A | 9/2006 |
| JP | 2012-515436 A | 7/2012 |
| WO | WO 99/39394 A1 | 8/1999 |
| WO | WO 2010/081137 A2 | 7/2010 |

OTHER PUBLICATIONS

Someya et al., "A Large-Area, Flexible, and Lightweight Sheet Image Scanner Integrated with Organic Field-Effect Transistors and Organic Photodiodes", 2004 IEEE International Electron Devices Meeting (IEDM), #15.1, pp. 365-368.
Written Opinion of the International Searching Authority for PCT/JP2018/000448 (PCT/ISA/237) dated Mar. 13, 2018.

* cited by examiner

[Figure 1]
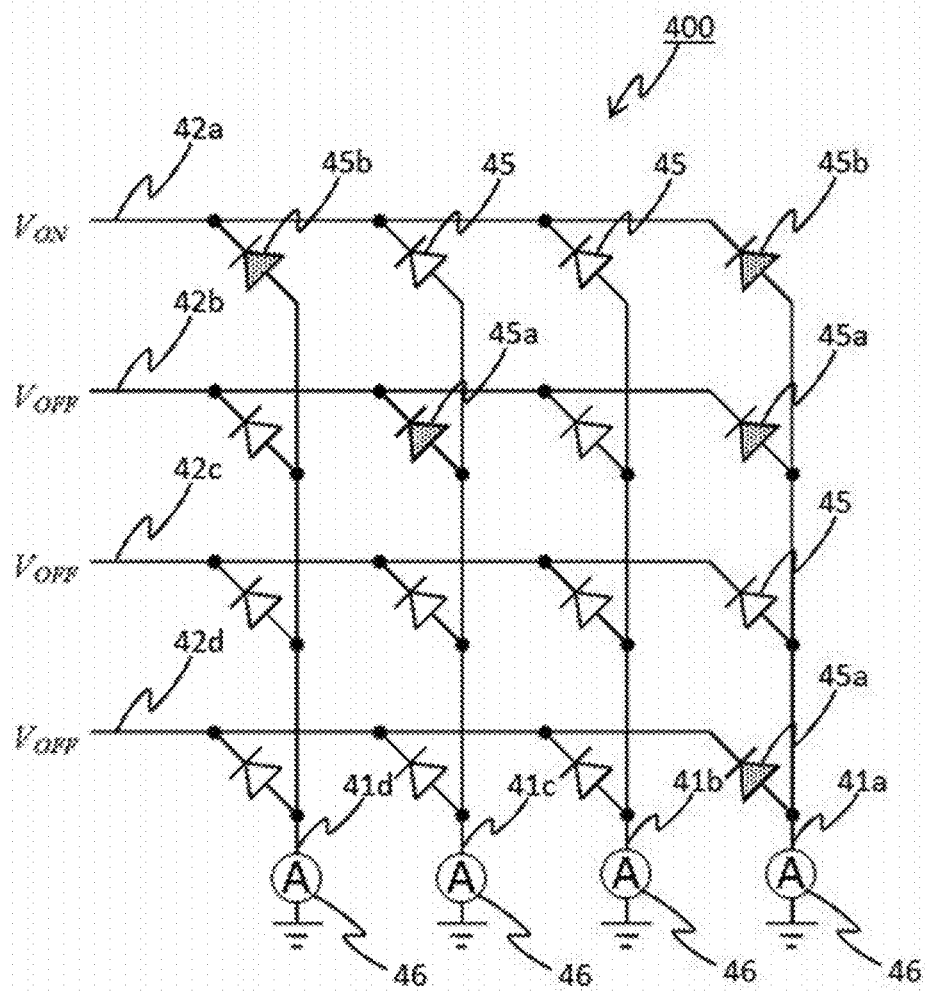

[Figure 2]
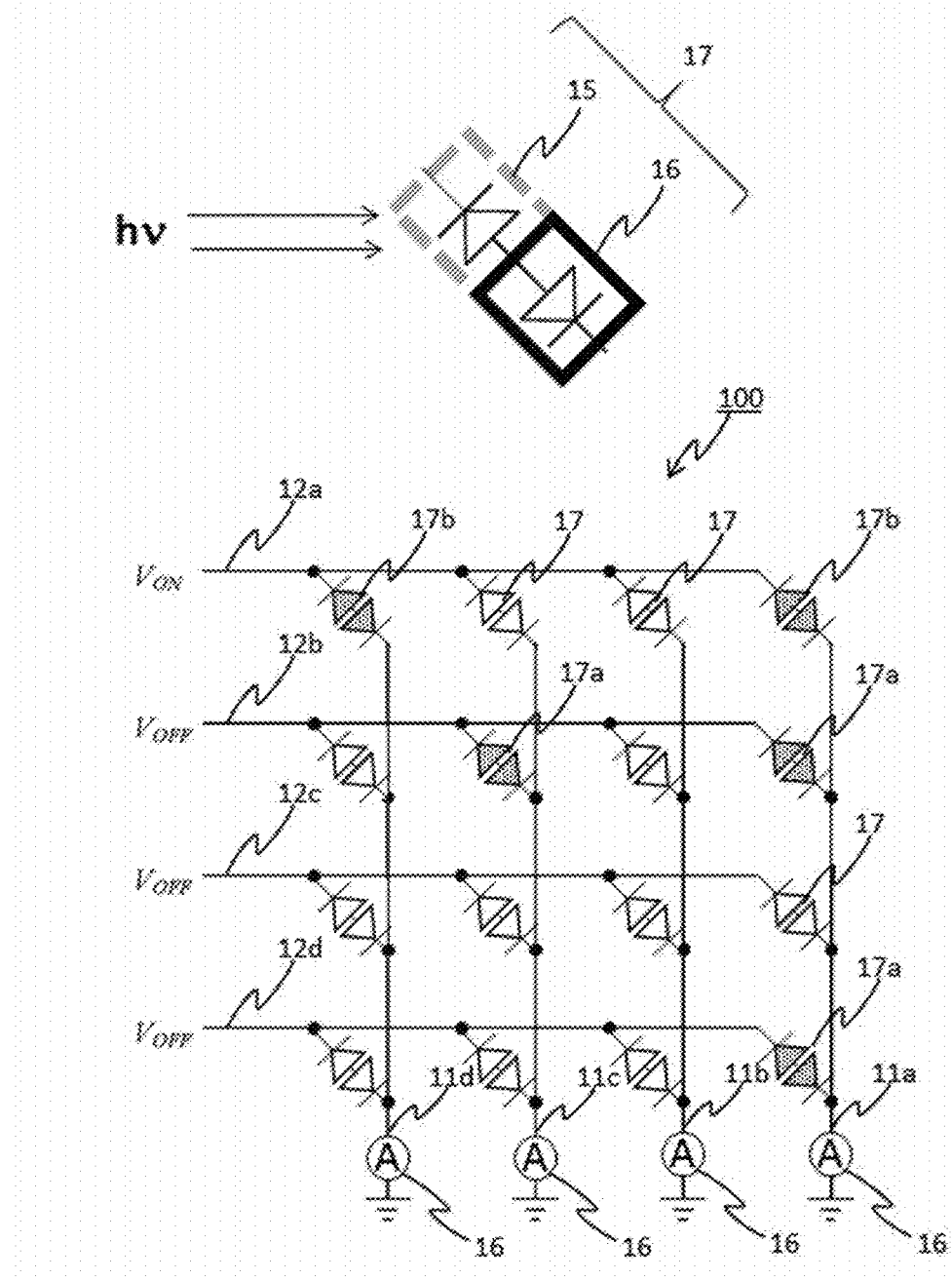

[Figure 3]
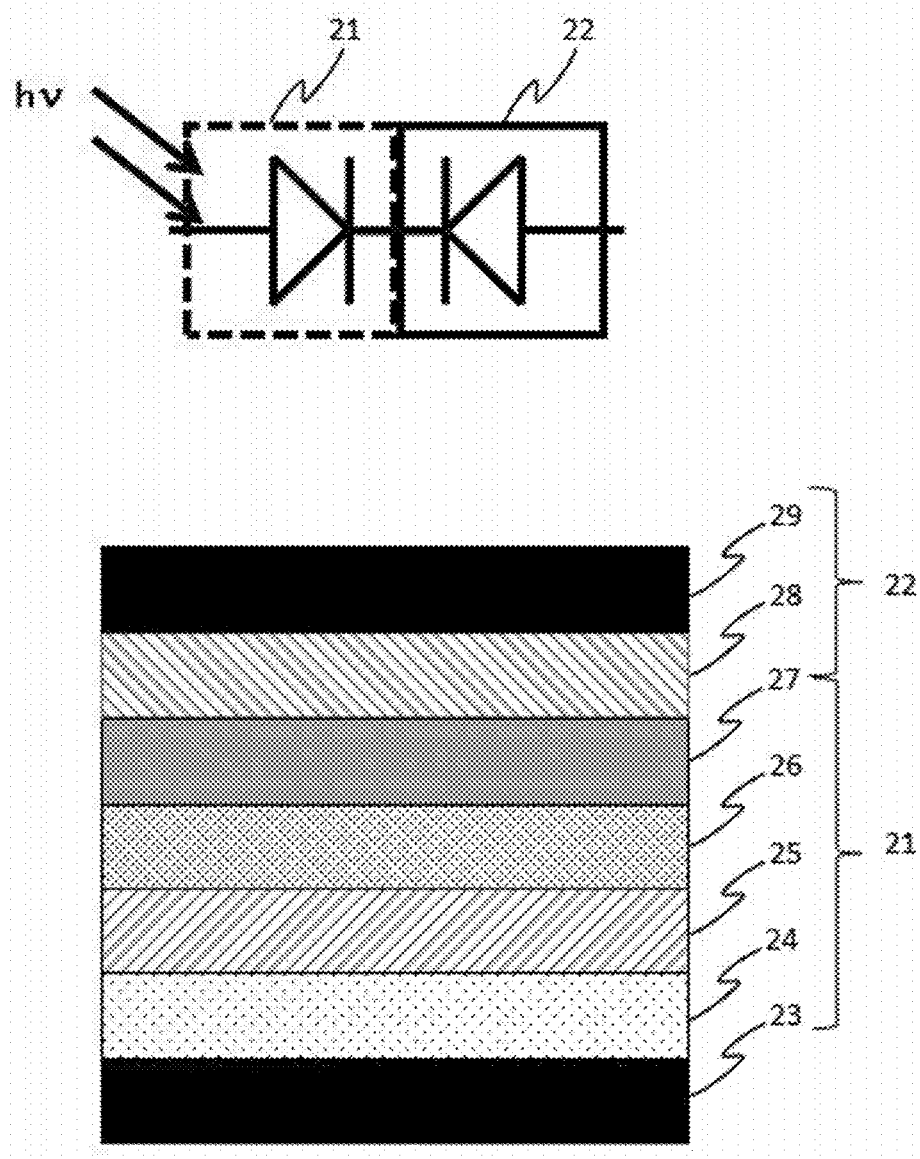

[Figure 4]
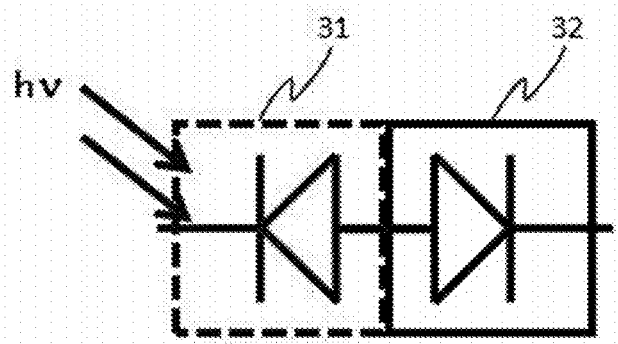
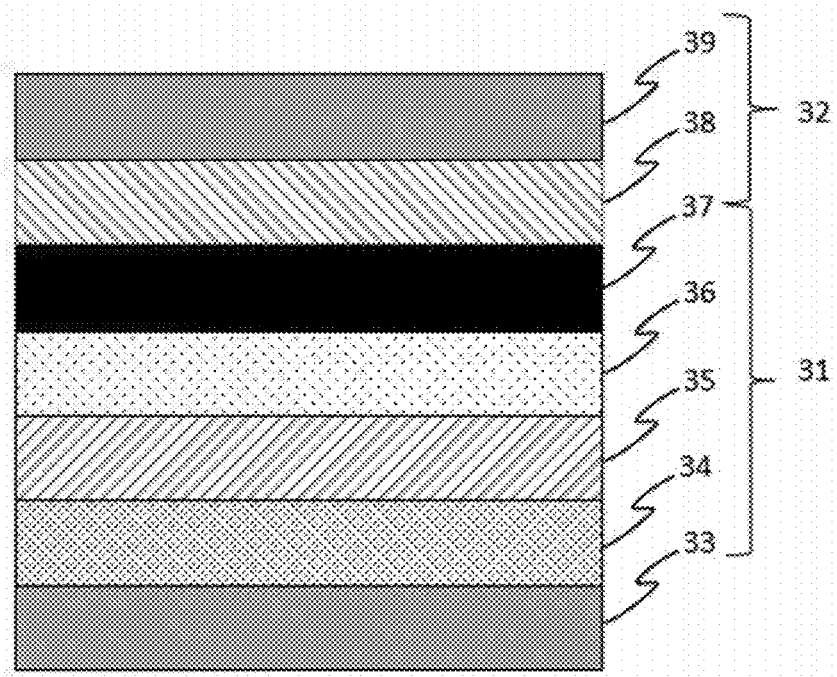

[Figure 5]
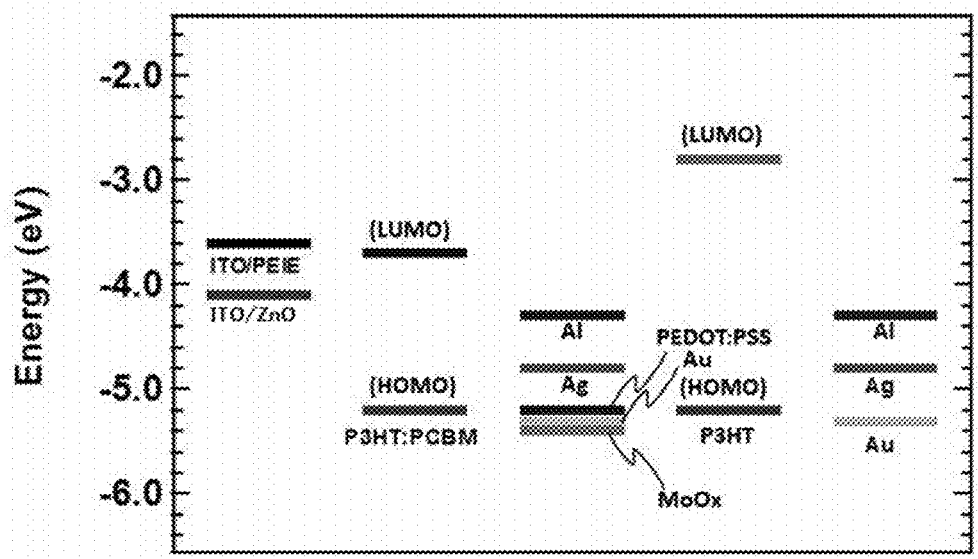

[Figure 6]
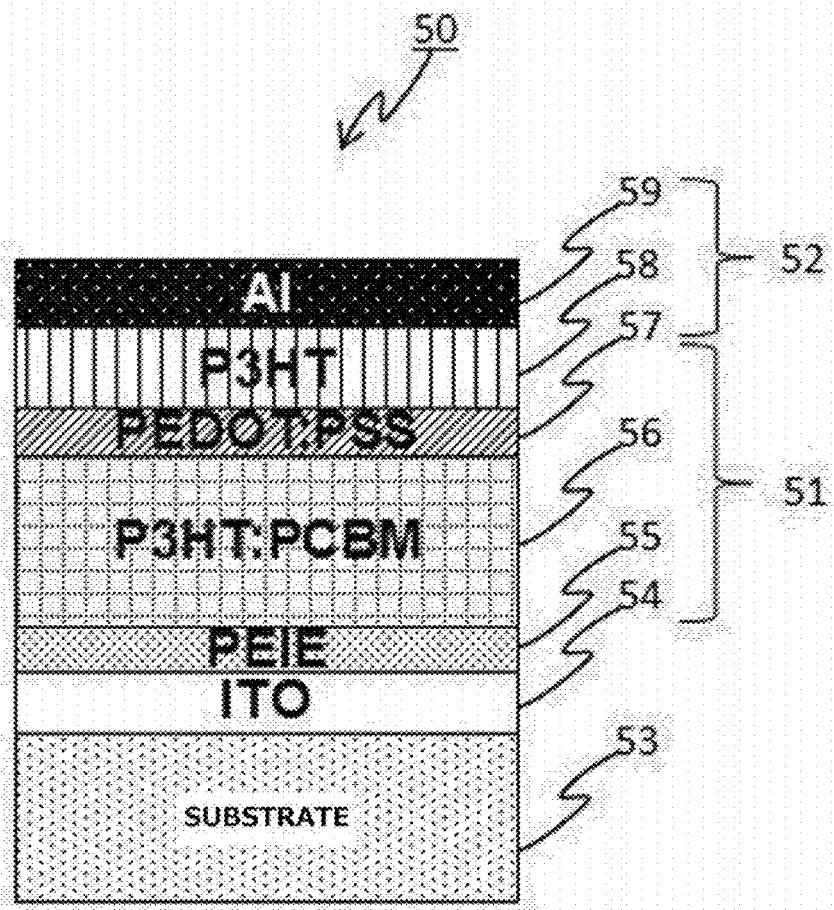

[Figure 7]
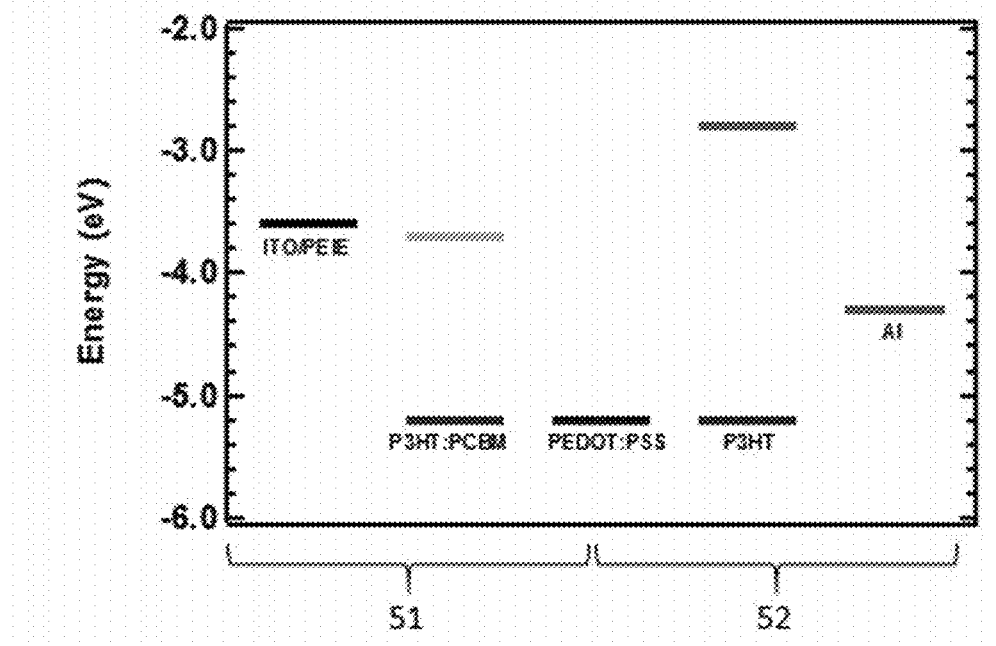

[Figure 8]
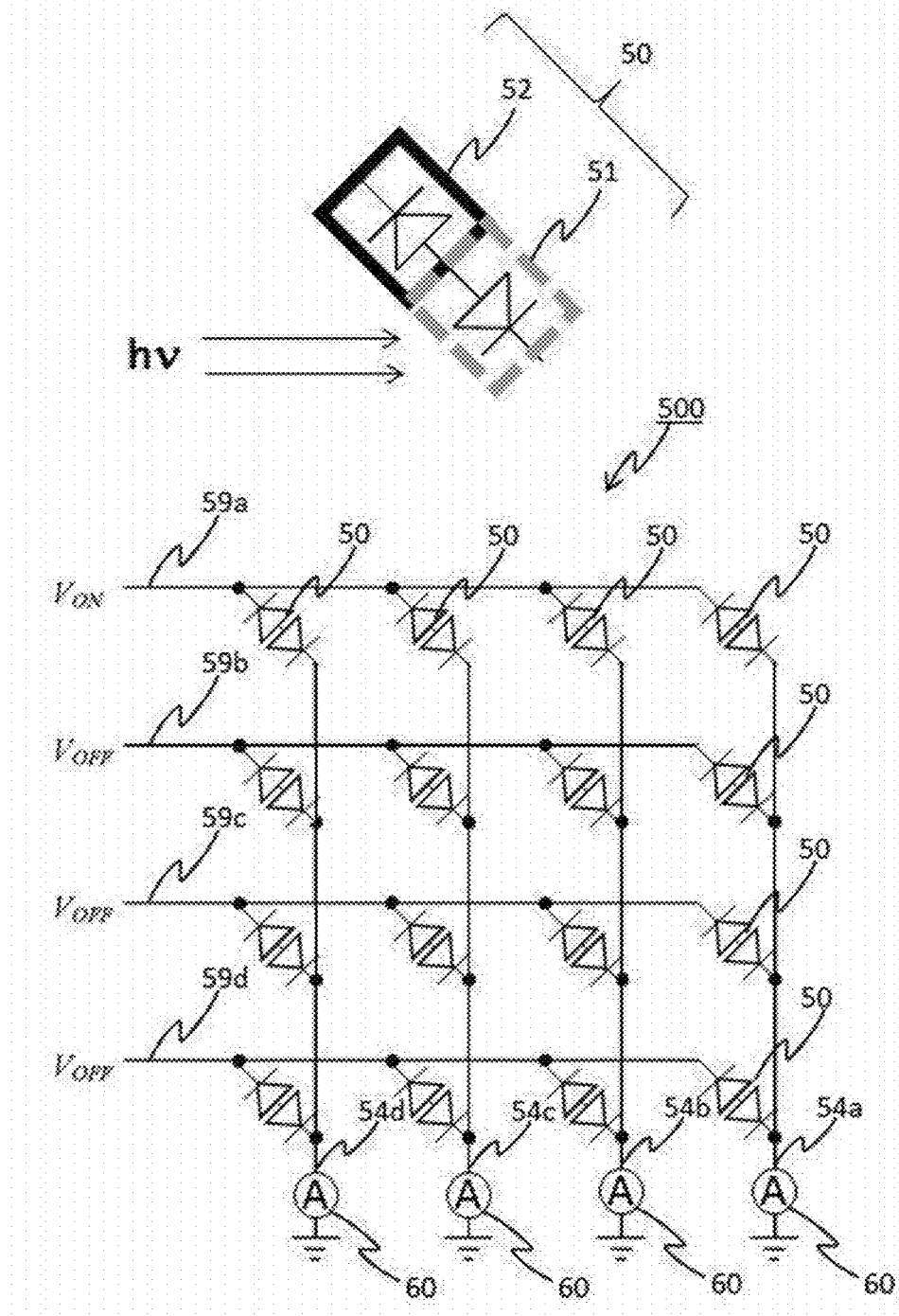

[Figure 9]
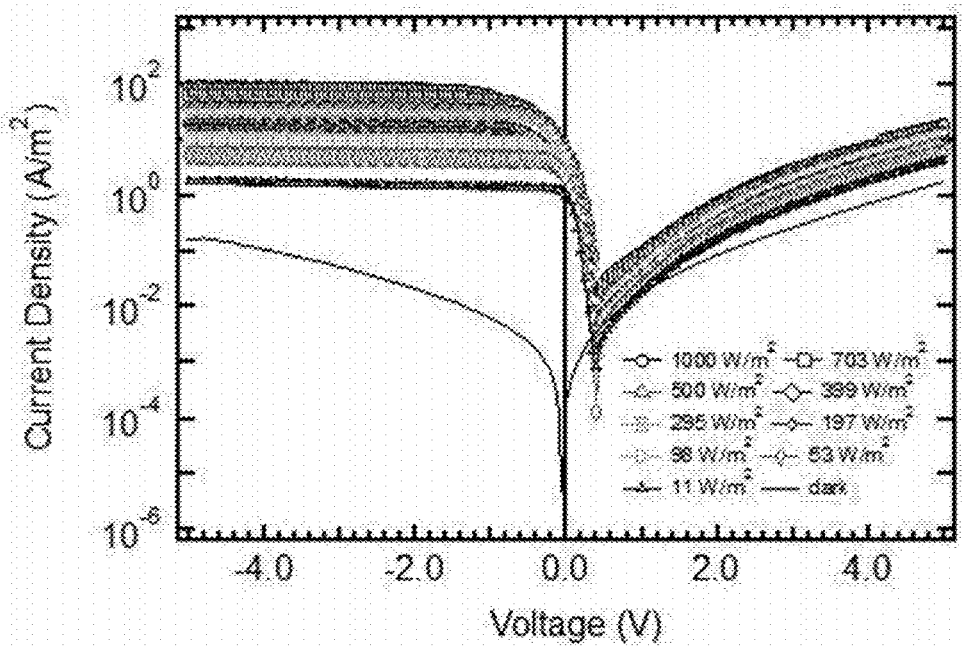

[Figure 10]
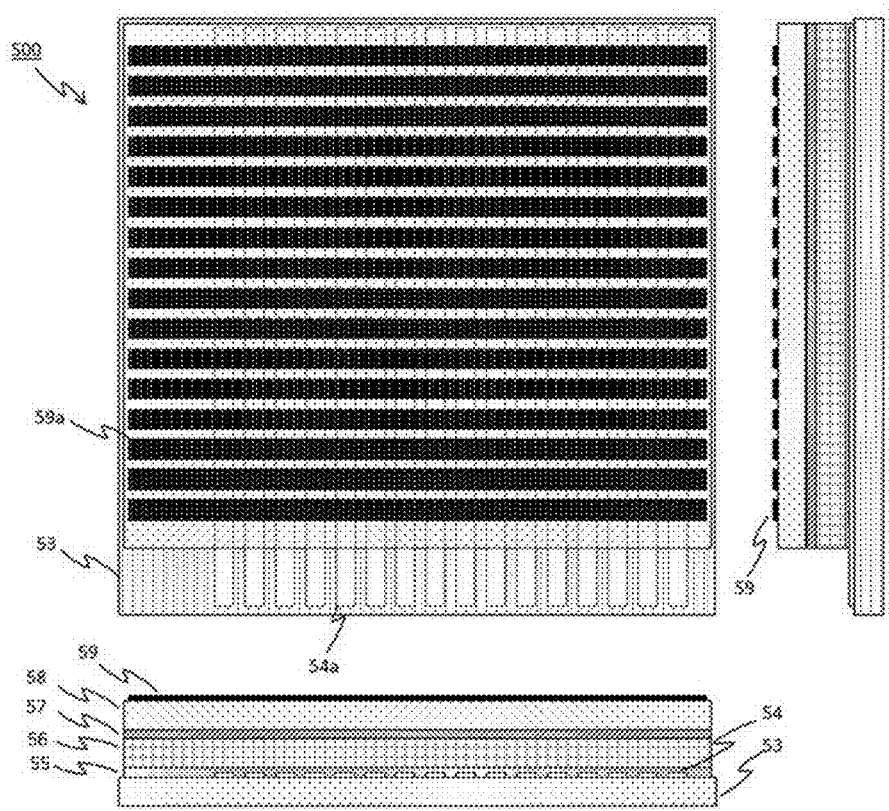
[Figure 11]
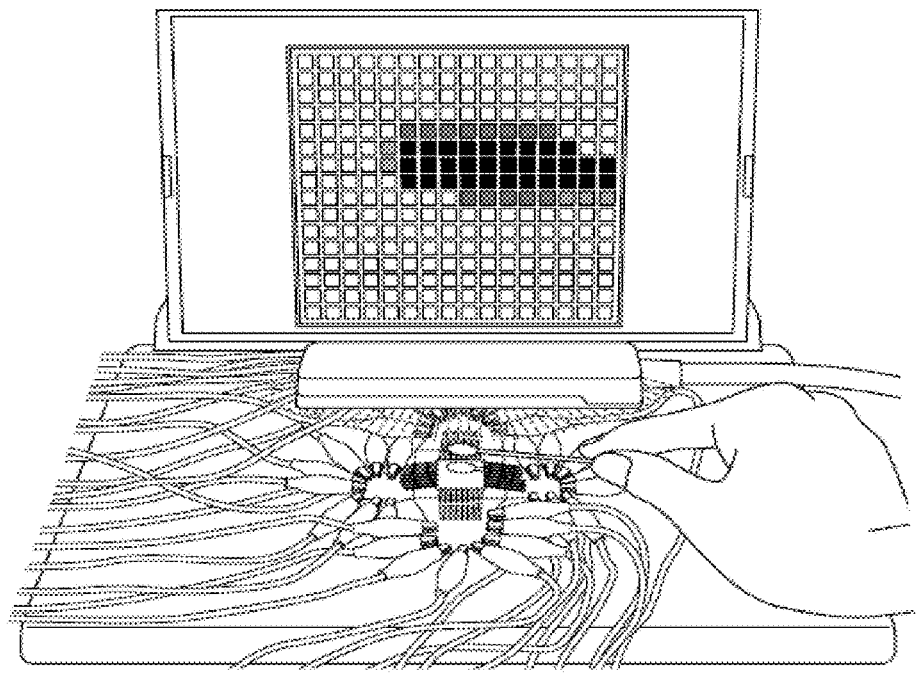

[Figure 12]
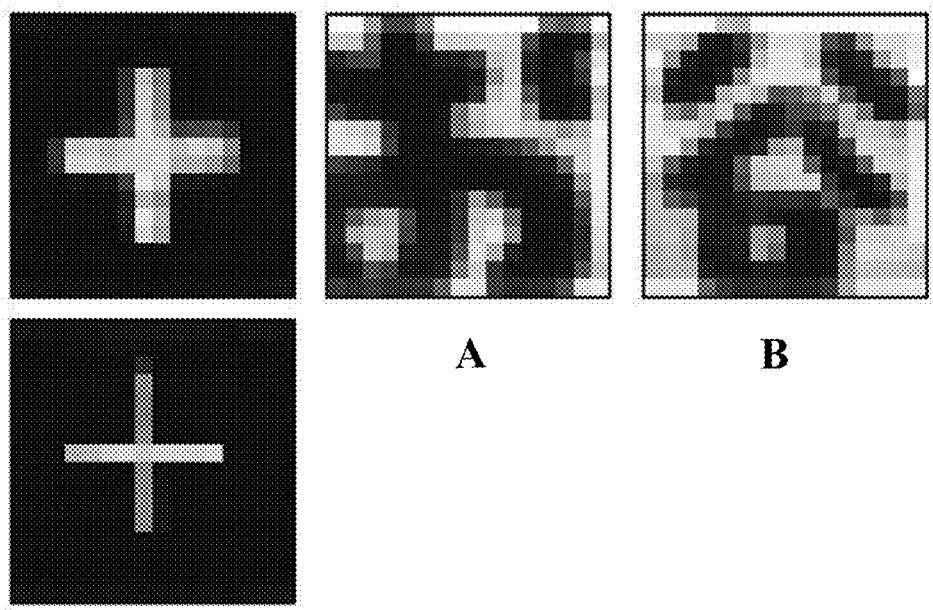
[Figure 13]
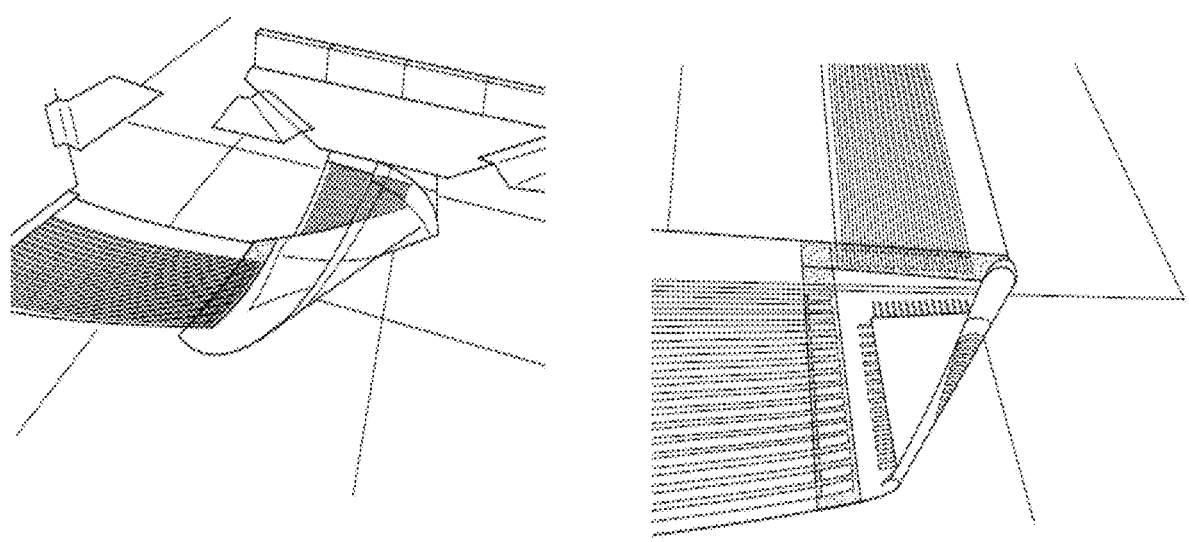

PHOTODETECTOR ARRAY

CROSS REFERENCE

The present application claims a priority based on Japanese Patent Application No. 2017-4745 filed on Jan. 15, 2017 in Japan, and all the contents described in the application are incorporated herein by reference in entirety. Furthermore, all the contents described in all the patents, patent applications and documents cited in the present application are incorporated herein by reference in entirety.

TECHNICAL FIELD

The present invention relates to a flexible sheet type optical image scanner. More specifically, the present invention relates to an optical image scanner suitable for an array operation in which photodetectors consisting of an organic semiconductor are two-dimensionally arranged on a sheet.

BACKGROUND ART

Image sensors of CCD (charged-coupled devices) and CMOS (complementary metal-oxide-semiconductor) embedded in digital cameras have been widely pervasive as image acquiring devices for capturing two-dimensionally light intensity distributions. These image sensors are constructed by densely arranging photodetectors in a two-dimensional array form and combining the photodetectors with a lens-based reduction projection optical system. A device called an image scanner has been widely pervasive as equipment for converting an image or document formed on a recording medium such as a paper medium into digital image information. In an image scanner, a recording medium is relatively scanned with an image sensor including photodetectors arranged in a one-dimensional array form relatively to obtain two-dimensional information. These devices need mechanisms for lens projection and scanning, and the device size is large with respect to the size of the image sensor, so that it is required to secure a distance from a measurement object.

On the other hand, a sheet type image scanner has been proposed in which a two-dimensional image sensor is in close contact with a measurement object. A sheet type image scanner disclosed in Non Patent Literature 1 is formed by arranging photodetectors of organic photodiodes consisting of an organic semiconductor in a two-dimensional array form on a flexible base member consisting of polyethylene naphthalate (PEN) resin. In addition, another PEN base member is provided with switching circuits each including an organic transistor, which are formed as a switch array, which is so-called active matrix type, in one-to-one correspondence with the photodetectors in order to read an output current from each photodetector. These two base members are stacked, and the photodetectors and the switching circuits are connected in one-to-one correspondence with conductive silver paste.

Patent Literature 1 discloses a diode-coupled active matrix type image sensor in which a diode consisting of a silicon semiconductor and a photodiode consisting of a silicon semiconductor serving as a photodetector are vertically stacked in a silicon substrate. With this configuration, current sneaking and voltage crosstalk appearing as noise and errors in a passive matrix array element can be avoided by a rectifying function of the diodes. In addition, a film structure of vertically-stacked materials between longitudinal and transverse wiring electrodes is in the form of a monolithically-layered device of photodetectors and switching circuits.

As described in these prior arts, to arrange the photodetectors in a two-dimensional array form and to detect light intensity accurately by each of the photodetectors, a switching element is necessary to be connected to each photodiode in series so as to electrically separate individual photodetectors provided at intersection portions of electrodes arranged in a matrix form from one another. The switching element may be a diode or a transistor. When a diode is used, anodes (positive electrodes) or cathodes (negative electrodes) are connected to each other in the connection between a photodiode and a diode.

CITATION LIST

Patent Literature

Patent Literature 1: U.S. Pat. No. 4,758,734

Non Patent Literature

Non Patent Literature 1: T. Someya, S. Iba, Y. Kato, T. Sekitani, Y. Noguchi, Y. Murase, H. Kawaguchi, and T. Sakurai, "A Large-Area, Flexible, and Lightweight Sheet Image Scanner", 2004 IEEE International Electron Devices Meeting (IEDM), #15.1, pp. 365-368, Hilton San Francisco and Towers, San Francisco, Calif., Dec. 13-15, 2004.

SUMMARY OF INVENTION

Technical Problem

Base members such as glass and silicon used for electronic devices consisting of inorganic semiconductors are prone to breaking and difficult to be freely bent. On the other hand, in electronic devices using organic materials such as organic semiconductors, because of softness possessed by the organic materials and film formability at a low temperature, flexible electronic equipment can be produced by forming electronic elements on a flexible plastic base member. In addition, film formation can be performed by a method of coating under the atmosphere and at room temperature, so that electronic equipment can be provided at low cost. However, a thin film consisting of an organic material is soluble in an organic solvent, so that it is impossible to apply an etching method utilizing patterning of an organic resist used in an inorganic semiconductor process. Likewise, dry etching based on high energy plasma used in the inorganic semiconductor process has a high etching rate and is difficult to control, so that it is difficult to form an organic semiconductor device having a stacked structure of a complicated pattern.

Therefore, the sheet type image scanner described in the Non Patent Literature 1 is constructed by forming organic transistors as switching elements and organic photodiodes as photodetectors on separate base members respectively, and connecting the organic transistors and the organic photodiodes when the two base members are stuck to each other. Since this configuration requires a mechanical process of bonding, the element is prone to damage, and the yield is lowered. In addition, there is a problem of a complicated structure and a cost increase.

In the photodetector described in Patent Literature 1, a blocking diode including a PN junction or PIN junction of silicon serving as a switching diode and a photodiode likewise including a PN junction or PIN junction of silicon are stacked with conductive amorphous silicon for electrically connecting the two diodes being interposed therebetween. However, film formation is performed in a high temperature process, so that it has been difficult to form the photodetectors on a plastic substrate.

In this configuration, since the silicon of the switching diode, the conductive amorphous silicon, and the silicon of the photodiode have high conductivity, it is necessary to separate the elements of the two-dimensionally arranged photodetectors from one another. In the blocking diodes, the silicon film is divided along individual electrodes by grooves. The conductive amorphous silicon is further patterned into divided rectangles along common electrodes. Thereafter, the grooves for dividing the elements are filled with an insulating material, and a transparent common electrode is formed on the elements. As described above, a number of patterns are required to be formed in the manufacture of a stacked device, and thus there is a problem of a cost increase of the process. Since the switching diodes and the photodiodes are patterned separately from each other, it has been difficult to realize the same configuration by using an organic semiconductor material having a limitation in the patterning method.

An object of the present invention, which has been made in view of the above circumstances, is to provide two-dimensionally arranged photodetectors suitable for an array operation by using an organic semiconductor material, and a flexibly bendable sheet type two-dimensional optical image scanner at a low price.

Solution to Problem

In order to solve the above problem, according to an aspect of the present invention, a photodetector array of a stacked film is provided. The stacked film comprises a plurality of first electrodes formed on a substrate and extending in parallel in a first direction, a plurality of second electrodes extending in parallel in a second direction crossing the first electrodes, a first organic thin film diode and a second organic thin film diode disposed between each of the first electrodes and each of the second electrodes, and an intermediate connection electrode layer serving as a common anode or a common cathode. The intermediate connection electrode layer connects the first organic thin film diode and the second organic thin film diode by backward-diode connection. In the photodetector array, at least either the first electrodes or the second electrodes are transparent with light passing therethrough, the first organic thin film diode is a photoresponsive organic diode, the second organic thin film diode is an organic rectifier diode, and the intermediate connection electrode layer operates so that, with respect to the first organic thin film diode and the second organic thin film diode connected thereto, positive holes are transferred as the common anode and electrons are transferred as the common cathode. According to this configuration, carriers generated in the photoresponsive organic diode by light irradiation can be read as current by application of a readout voltage, and at the same time, current becomes as small as possible by application of a non-readout voltage in a photodetector irradiated with light, so that it is possible to suppress crosstalk between photodetectors and realize high-quality photodetection in an extremely simple configuration in which a stacked film is merely formed between plural crossing first and second electrodes.

In the configuration of the above photodetector array, the first organic thin film diode is a heterojunction type, preferably a bulk heterojunction type photoresponsive organic diode, and the second organic thin film diode is a single carrier type or Schottky type organic rectifier diode. According to this configuration, a high-sensitivity photodetector array can be realized with a small number of stacked layers.

In the configuration of the above photodetector array, the first organic thin film diode and the second organic thin film diode have the same energy level for transporting carriers of electrons or holes transferred through the intermediate connection electrode layer, preferably organic semiconductor materials transporting the carriers are same. According to this configuration, carriers generated in the photoresponsive organic diode by light irradiation can be read as current by application of a low readout voltage. By setting the readout voltage to be low, dark current can be suppressed and high-quality photodetection with low noise can be performed.

In the configuration of the above photodetector array, the intermediate connection electrode layer is insoluble in a solvent used when the film of the first or second organic thin film diode is formed by coating means. According to this configuration, when the organic thin film diode is formed on the intermediate connection electrode layer by the coating method, the intermediate connection electrode layer blocks the solvent, so that the organic thin film diode which has been already formed under the intermediate connection electrode layer can be prevented from being re-dissolved by the solvent. As a result, it is possible to manufacture a photodetector array having a large area at a low price by the coating method.

In the configuration of the above photodetector, the stacked film is formed through the plural photodetectors formed between the plural first electrodes and the plural second electrodes. According to this configuration, the edge of the stacked film is reduced as much as possible, and a highly durable photodetector array can be realized.

In the configuration of the above photodetector, the intermediate connection electrode layer consists of an organic conductive material or a metal oxide conductive material. According to this configuration, the intermediate connection electrode layer has a sufficiently low resistance to make current flow longitudinally, and at the same time, no current flows transversely due to high resistance. Therefore, crosstalk between photodetectors can be suppressed without patterning the intermediate connection electrode layer so that the intermediate connection electrode layer is separated into individual photodetectors.

Note that the configurations of the inventions can be arbitrarily combined with each other.

From a different perspective of the present invention, a process for producing a photodetector array comprises the steps of: applying an active layer of a first organic thin film diode to a plurality of first electrodes formed on a substrate and extending in parallel in a first direction; applying an intermediate connection electrode layer serving as a common anode or a common cathode on the active layer of the first organic thin film diode; applying a semiconductor layer of a second organic thin film diode to the intermediate connection electrode layer; and forming a plurality of second electrodes extending in parallel in a second direction crossing the first electrodes on the semiconductor layer of the second organic thin film diode.

Advantageous Effects of Invention

According to the present invention, a high-quality photodetection array in which crosstalk between photodetectors is suppressed with a simple configuration that a stacked film is merely formed between plural first and second electrodes crossing each other can be realized by using organic semiconductor materials. This simple configuration enables fabrication of an electronic device using organic semiconductor materials and enables realization of a large-area and flexible photodetector array that is a feature of an organic semiconductor electronic device. Moreover, cost reduction which is another feature of the organic semiconductor device can be realized. Since devices are stacked vertically, it is capable of wiring less complex and obtaining a broader light receiving area ratio as compared with a method of connecting elements arranged side by side.

BRIEF DESCRIPTION OF DRAWINGS

FIG. 1 is a circuit diagram schematically showing a conventional passive matrix photodetector array to describe effectiveness of the present invention.

FIG. 2 is a circuit diagram schematically showing a circuit configuration of a photodetector array according to an embodiment of the present invention.

FIG. 3 schematically shows a stacked film configuration of the photodetector according to the embodiment of the present invention.

FIG. 4 schematically shows the stacked film configuration of the photodetector according to the embodiment of the present invention.

FIG. 5 is a diagram showing the relationship of energy levels in the stacked film configuration of the photodetector according to the embodiment of the present invention.

FIG. 6 schematically shows the stacked film configuration of the photodetector according to the embodiment of the present invention.

FIG. 7 is a diagram showing the relationship of energy levels in the stacked film configuration of the photodetector according to the embodiment of the present invention.

FIG. 8 is a circuit diagram schematically showing a circuit configuration of a photodetector array according to the embodiment of the present invention.

FIG. 9 a diagram showing element characteristics of the photodetector according to the embodiment of the present invention.

FIG. 10 is a plan view and a side view showing the structure of a photodetector array according to the embodiment of the present invention.

FIG. 11 is a diagram showing the operation of the photodetector array according to an example of the present invention.

FIG. 12 is a diagram showing the operation of a photodetector array according to another example of the present invention.

FIG. 13 is a diagram showing a form of a photodetector array according to another example of the present invention.

REFERENCE SIGNS LIST 11, 12, 54, 59 . . . electrode; 15, 21, 31, 51 . . . photodiode; 16, 22, 32, 52 . . . rectifier diode; 17, 50 . . . photodetector; 500 . . . photodetector array

DESCRIPTION OF EMBODIMENTS

Hereinafter, a configuration of a photodetector array to which the present invention is applied will be described with reference to the drawings. In the drawings used in the following description, in order to make features understandable easily, portion having the features may be enlarged and shown for the sake of convenience, and the dimensional ratio of components is not necessarily the same as the actual one. Materials, dimensions and the like exemplified in the following description are merely examples, and the present invention is not limited to these examples and can be appropriately changed and implemented without changing the subject matter of the invention.

FIG. 1 is a circuit diagram schematically showing a passive matrix type photodetector array 400 showing a problem to be solved by the present invention. In FIG. 1, photodiodes 45 which are photodetectors are arranged in an array form at plural intersection portions of plural first electrodes 41a, 41b, 41c and 41d extending longitudinally and plural second electrodes 42a, 42b, 42c and 42d extending transversely. Here, a state where the plural photodiodes 45a and 45b are irradiated with light and carriers are generated in the photodiodes is assumed. The light intensity is measured by applying a readout voltage Von and measuring the carriers as a current value with an ammeter 46. In a passive matrix readout method, the transversely-extending second electrodes are set as common electrodes, and the readout voltage Von is sequentially applied to the plural common electrodes to measure currents flowing in the longitudinally-extending first electrodes which are individual electrodes. At this time, ideally, it is required to detect only the amount of carriers in the photodiode formed at the intersection portion between a common electrode to which the readout voltage Von is applied and an individual electrode. However, in the photodiode irradiated with light, crosstalk in which current flows between the individual electrode and the common electrode due to photovoltaic power occurs even when the voltage level of the common electrode is a non-readout voltage Voff. For example, when the amount of carriers in the photodiode 45b is measured, current also flows in the photodiode 45a which is connected to the same individual electrode as the photodiode 45b and irradiated with light. As a result, in the current flowing through the ammeter 46, a crosstalk current flowing through the photodiode 45a causes an error in the current flowing through the photodiode 45b. As a method of solving this problem is known a method for connecting a rectifier diode (blocking diode) to each photodiode by backward-diode connection so that no crosstalk current flows.

FIG. 2 is a circuit diagram schematically showing a photodetector array 100 of the present invention. In FIG. 2, photoresponsive organic diodes (organic photodiodes) 15 and organic rectifier diodes 16 are arranged as combined diodes 17 in an array form at plural intersection portions of plural longitudinally-extending first electrodes 11a, 11b, 11c, and 11d and plural transversely-extending second electrodes 12a, 12b, 12c, and 12d, each combined diode 17 including a photoresponsive organic diode 15 and an organic rectifier diode 16 which are connected to each other by backward-diode connection with the anodes thereof being made common. As in the case of the passive matrix, a readout method sets the transversely-extending second electrodes as common electrodes, and sequentially applies the readout voltage Von to the plural common electrodes to measure currents flowing in the longitudinally-extending first electrodes which are individual electrodes. At this time, the non-readout voltage Voff is applied to the other common electrodes, and in diodes 17a irradiated with light hv, current is blocked by the organic rectifier diodes 16 connected to the respective diodes 17a, so that crosstalk current is suppressed to a small value.

In the present invention, the photoresponsive organic diodes 15 and the organic rectifier diodes 16 are formed by stacking thin films consisting of organic semiconductor materials. FIG. 3 shows a stacked film configuration of diodes which are connected to each other by the backward-diode connection with a generalized common cathode layer. Organic semiconductor films are stacked on both sides of an intermediate connection electrode layer 27 which is a common cathode electrode layer and interposed between the organic semiconductor films, and both ends are terminated by anode electrodes 23 and 29. The photoresponsive organic diode 21 has a stacked structure including the anode electrode 23, a hole transporting layer 24, an active layer 25, an electron transporting layer 26, and the cathode electrode 27, and the organic rectifier diode 22 has a stacked structure including the anode electrode 29, an organic semiconductor layer 28 and the cathode electrode 27.

FIG. 4 shows a stacked film configuration of diodes which are connected to each other by the backward-diode connection with a generalized common anode layer. Organic semiconductor films are stacked on both sides of an intermediate connection electrode layer 37 which is a common anode electrode layer and interposed between the organic semiconductor films, and both ends are terminated by cathode electrodes 33 and 39. The photoresponsive organic diode 31 has a stacked structure including a cathode electrode 33, an electron transporting layer 34, an active layer 35, a hole transporting layer 36, and an anode electrode 37. The organic rectifier diode 32 has a stacked structure including a cathode electrode 39, an organic semiconductor layer 38 and the anode electrode 37.

In FIGS. 3 and 4, an active layer constituting the photoresponsive organic diode absorbs light (generally an electromagnetic wave) to generate carriers consisting of electron-hole pairs. Therefore, at least one of the electrodes at both the ends has transparency to transmit light (generally an electromagnetic wave) therethrough so that the active layer can be irradiated with light from the outside. For the active layer may be used a Schottky type utilizing an interface between an organic semiconductor and metal, a planar heterojunction type in which p-type and n-type organic semiconductor thin films are stacked, and a bulk heterojunction type including a thin film in which p-type and n-type semiconductor materials are randomly mixed. The bulk heterojunction type out of these types has not only a high efficiency, but also an excellent advantage that the active layer can be formed by a small number of steps because the active layer can be formed by merely coating one layer of solution in which organic semiconductors are mixed. In order to extract holes from the active layer via the anode and electrons from the active layer via the cathode to make current flow, it is preferable that carriers can efficiently migrate from the active layer to the anode and the cathode. The migration of the carriers is limited because the energy level difference between the electrode and the active layer serves as a barrier. A hole transporting layer (or hole injection layer) or an electron transporting layer (or electron injection layer) serving as a matching layer of carrier energy levels between the electrode and the active layer may be inserted to reduce this barrier.

The photoresponsivity between the photoresponsive organic diode (organic photodiode) and the organic rectifier diode which are connected to each other by backward-diode connection has not been hitherto known, and applicability thereof to a photodetector array and an optimum configuration have not been apparent. In particular, the organic rectifier diode is required to function as a non-photoresponsive diode, but it has been generally known that organic diodes exhibit photoresponsivity to some extent. Therefore, in conventional photodetector arrays using silicon semiconductors, it has been necessary to take a countermeasure such as provision of a light shielding property to an intermediate connection electrode layer. However, in order to obtain a necessary light shielding property, the intermediate connection electrode layer must be formed thickly, and in order to separate adjacent elements from each other, the intermediate connection electrode layer is required to be formed in such a pattern that the intermediate connection electrode layer is separated to individual photodetectors. The inventors of the present invention have researched a film configuration capable of obtaining current contrast between readout and non-readout of carriers generated by light irradiation, and has found that both the two functions are compatible with each other by appropriately setting a current barrier related to carrier transport between films. Particularly, in order to obtain current contrast with a low voltage, it has been found to be important that a current barrier when the intermediate connection electrode layer formed between the two organic diodes receives carrier charges generated in the organic photodiode by light irradiation and transfers the carrier charges to the organic rectifier diode side is selected to be as small as possible. In other words, the intermediate connection electrode layer is selected to transfer holes as a common anode and electrodes as a common cathode with a low barrier between the organic photodiode and the organic rectifier diode which are connected to each other by the intermediate connection electrode layer. In addition, it has been found that by appropriately selecting the material of the intermediate connection electrode layer, the photodetector can be separated in an array form although it is an as-deposited film as described later.

FIG. 5 shows the energy levels of highest occupied molecular orbitals (HOMO) and lowest unoccupied molecular orbitals (LUMO) of the active layer of the organic photodiode and the semiconductor layer of the organic rectifier diode, and the energy levels of work functions of the cathode electrode material and the anode electrode material. In this case, the organic photodiode uses a bulk heterojunction type active layer of P3HT:PCBM in which P3HT (poly-3-hexylthiophene-2,5-diyl) of a p-type polymer semiconductor and PCBM ([6,6]-phenyl-$C_{61}$-methyl butyrate) of an n-type organic semiconductor are randomly mixed. In addition, in the organic rectification diode, P3HT is used as the organic semiconductor layer.

These materials are connected to each other by the intermediate connection electrode layer serving as a common anode electrode. In order to perform excellent transfer of charges between the organic semiconductor layers (the active layer of the organic photodiode and the organic semiconductor layer of the organic rectifier diode) which are directly stacked on the intermediate connection electrode layer, in the case of the common anode electrode, it is very effective to match the work function of the intermediate connection electrode material with the HOMO level to which the holes are transported. The term "effective" as used herein means that a voltage barrier is suppressed to a low level at the interface between stacked layers and photogenerated carriers can be extracted as a current with a low voltage. The HOMO levels participating in hole transport of P3HT:PCBM and P3HT are approximately −5.2 eV. This is because P3HT which is a p-type semiconductor participates in hole transport in P3HT:PCBM and P3HT. As described above, with respect to the organic semiconductor used for the organic rectifier diode and the organic semiconductor used for the active layer of the photoresponsive organic diode, materials having similar compositions or the same material is used as organic semiconductor materials for transporting carriers to be transferred via the intermediate connection electrode, whereby the energy levels of the organic semiconductors can be matched with the same level. Note that the work function is a potential difference required to extract electrons in a solid to the outside, and is defined as an energy difference between a vacuum level and a Fermi level. HOMO (Highest Occupied Molecular Orbital) of the organic semiconductor means a highest energy orbital in which electrons occupy, and LUMO (Lowest Unoccupied Molecular Orbital) is a lowest energy orbital in which no electron occupies.

Accordingly, in addition to the above-described P3HT, p-type semiconductor materials having sensitivity to light having wavelengths similar to or different from that of the P3HT are also usable as the p-type polymer semiconductor material used as the active layer of the organic photodiode and/or the semiconductor layer of the organic rectifier diode. For example, there can be cited poly(3-alkylthiophene) groups such as poly(3-octylthiophene-2,5-diyl)(P3OT), poly(3-dodecylthiophene-2,5-diyl)(P3DDT), poly[bis (4-phenyl) (2,4,6-Trimethylphenyl) amine](PTAA), poly[2-methoxy-5-(2-ethylhexyloxy)-1,4-phenylenevinylene](MEH-PPV), poly[2-methoxy-5-(3',7'-Dimethyloctyloxy)-1,4-phenylenevinylene](MDMO-PPV), poly[(9,9-di-n-octylfluorenyl-2,7-diyl)-alt-(benzo[2,1,3]thiadiazole-4,8-diyl)](F8BT), poly[(9,9-dioctylfluorenyl-2,7-diyl)-co-bithiophene] (F8T2), and poly(3-octylthiophene-2,5-diyl-co-3-desiloxythiophene-2,5-diyl)(POT-co-DOT). P3HT, F8T2, PTAA and the like are preferable among these materials, and MDMO-PPV or POT-co-DOT can be used as the p-type semiconductor material which has a small band gap and can adopt a bulk heterostructure.

In addition to fullerene derivatives represented by PCBM described above, Boramer T01, Boramer TC03 and the like which are boron-containing n-type polymers, and poly(benzobisimidazobenzophenanthroline)(BBL) and the like which are ladder polymers can be used as the n-type organic semiconductor. These materials are commercially sold as organic electronic materials, and can be purchased from, for example, Sigma Aldrich company.

FIG. 5 presents the work functions of metal materials of aluminum (Al), silver (Ag) and gold (Au), an organic semiconductor material of PEDOT:PSS (poly-3,4-ethylenedioxythiophene-polystyrene sulfonic acid), and an oxide conductor of molybdenum oxide (MoOx) which are material candidates for the intermediate connection electrode layer. Aluminum is not preferable because it has a large work function of −4.3 eV and thus has a large energy difference. Silver has a work function of −4.7 eV, and the energy difference is permissible. On the other hand, since gold has a work function of −5.3 eV, molybdenum oxide has a work function of −5.5 eV, and PEDOT:PSS has a work function of −5.1 ev and these materials make it possible to reduce the energy difference, so that these materials are suitable for the intermediate connection electrode material as the common cathode. Accordingly, in a preferred embodiment, the difference between the energy level of the highest occupied molecular orbital (HOMO) of the active layer of the first organic thin film diode and/or the semiconductor layer of the second organic thin film diode and the energy level of the work function of the intermediate connection electrode layer material is 0.5 eV or less, preferably 0.3 eV or less.

An electrode material which is matched with the LUMO level of P3HT:PCBM is selected as the cathode material of the organic photodiode so that it can excellently receive electrons from P3HT:PCBM. In addition, in order to receive light irradiation from the organic photodiode side, the cathode electrode of the organic photodiode is necessary to be transparent to incident light. ITO (indium tin oxide) is suitable as a transparent conductor. However, the work function of ITO is as large as about −5 eV, and has an extremely large energy difference from the LUMO level of P3HT:PCBM. Therefore, the surface of ITO is modified with zinc oxide or PEIE (polyethyleneimine ethoxylate) to improve electron injection performance. The work function of PEIE is approximately from −3.4 eV to −3.6 eV, and thus the cathode electrode can be configured to match the LUMO level of P3HT:PCBM.

As the organic rectifier diode, a pn diode type, a PIN diode type, a Schottky diode type or the like can be applied. Among these diode types, a Schottky diode is suitable because it can realize a rectifying function with a very simple structure by stacking an organic semiconductor and a conductive material. Al having an energy difference enabling formation of a barrier with the HOMO level of P3HT which is a p-type semiconductor is suitable as the cathode electrode material because Al forms a Schottky junction with the organic semiconductor of P3HT. In addition, a wide gap semiconductor having a large HOMO-LUMO level difference is selected as a double carrier organic semiconductor in which both holes and electrons flow.

With respect to the stacked film configuration of the diodes which are connected to each other with the common anode layer shown in FIG. 4 by the backward-diode connection, the appropriate configuration of the energy levels of the stacked film has been described in the foregoing description. The same argument is applicable to the stacked film configuration of the diodes which are connected to each other with the common cathode layer shown in FIG. 3 by the backward-diode connection. However, it is more difficult to ensure matching of the LUMO level for transferring electrons through the common cathode than to select materials for achieving matching at the HOMO level. Therefore, the configuration of the common anode is excellent in that a material selecting range is broad and it is easy to realize a photodetector having high sensitivity and a photodetector having wide wavelength sensitivity.

FIG. 6 shows an embodiment of a photodetection element 50 in the photodetector array of the present invention. In a stacked film configuration of FIG. 6, an ITO transparent electrode 54 is formed as a first electrode (cathode electrode) on a transparent substrate 53 consisting of glass or plastic. An electron injection layer 55 consisting of PEIE is stacked on the surface of the ITO transparent electrode 54. An active layer 56 of a bulk heterojunction type photoresponsive organic diode of P3HT:PCBM is stacked on the electron injection layer 55, and a common anode 57 of PEDOT:PSS is further stacked, to form a photoresponsive organic diode 51.

A stacked film is further formed on the photoresponsive organic diode 51 to form an organic rectifier diode 52. In other words, an organic semiconductor layer 58 consisting of P3HT and an Al electrode 59 serving as a second electrode (cathode electrode) are stacked on the common anode 57, and a Schottky diode based on Schottky junction between the organic semiconductor layer 58 and the Al electrode 59 is formed. FIG. 7 is a diagram showing the energy levels of the films in the embodiment of the stacked film configuration of FIG. 6.

FIG. 8 is a circuit diagram schematically showing an embodiment of a photodetector array 500 including photodetection elements 50 shown in FIG. 6. In FIG. 8, the photodetection elements 50 are formed at plural intersection portions between first electrodes 54a, 54b, 54c, and 54d including plural ITO transparent electrodes 54 extending longitudinally on a transparent substrate and second electrodes 59a, 59b, 59c and 59d including plural Al electrodes 59 extending transversely. The cathodes of photoresponsive organic diodes (organic photodiodes) 51 constituting the photodetection elements 50 are the first electrodes 54, and the cathodes of organic rectifier diodes 52 are the second electrodes 59.

In the photodetector array 500 shown in FIG. 8, the first electrodes 54a, 54b, 54c, 54d function as individual electrodes, and the second electrodes 59a, 59b, 59c, 59d function as common electrodes. The readout of an intensity distribution of light irradiation hv with which the light detector array 500 is being irradiated is collectively performed on the photodetectors 50 connected to one common electrode 59. For example, when one common electrode 59a is selected, a readout voltage Von is applied to the common electrode 59a from an external power supply (not shown). Von has a polarity for applying a reverse voltage to the photoresponsive organic diode, and is a negative voltage in the circuit diagram of FIG. 8. Simultaneously with this readout timing, a non-readout voltage Voff is applied to the non-selected common electrodes 59b, 59c, and 59d. Voff is appropriately set so that currents flowing through photodetectors 50 connected to the non-selected common electrodes 59b, 59c and 59d are sufficiently small in a state where these photodetectors 50 are irradiated with light.

FIG. 9 shows a result obtained by measuring the relationship between the applied voltage and the current while changing the irradiation light intensity with respect to the photodetection element 50 shown in FIG. 6. When no light is irradiated (dark), the photodetection element 50 exhibits a diode characteristic in which the current is equal to zero at an applied voltage of 0V, but exponentially increases with increase of a negative or positive applied voltage. On the other hand, when light is irradiated, the current value becomes minimum at an applied voltage of about 0.5 V, and the current increases asymmetrically when the voltage is decreased or increased with respect to this local minimum point. A voltage that provides the minimum current has a substantially constant value regardless of the irradiation light intensity. As the applied voltage is changed from the voltage providing the local minimum point to a negative side, the current passes through a rapidly increasing transition region and exhibits a constant value. A threshold voltage at which the current exhibits this constant value shifts to a larger negative value as the light intensity increases. This phenomenon occurs due to an influence of electric field caused by space charges in a thin film space as the number of carriers of hole-electron pairs generated by the light irradiation increases. This is because a high external applied voltage is required to suppress the space charges and quickly extract the carriers as current. In the embodiment of the present invention, when a voltage of approximately −2 V is applied in a range of the light irradiation intensity up to 1000 W/m$^2$, the current exhibits a constant value regardless of the applied voltage, and at this time the current is approximately proportional to the light irradiation intensity. When a two-dimensional distribution of light irradiation intensity is imaged, it is preferable that such a proportional relationship between the light irradiation intensity and the output is obtained. Accordingly, in the circuit diagram shown in FIG. 8, it is preferable to set the readout voltage Von in an applied voltage range in which the current output is constant with respect to the applied voltage.

On the other hand, since the non-readout voltage Voff is required to reduce the current flowing through the photodetection element, it is preferable to set the applied voltage providing the minimum value of the current in the photodetection element characteristic shown in FIG. 9. In the element characteristic of FIG. 9, it is optimal to set Voff to 0.5 V.

FIG. 10 is a plan view and a side view showing an embodiment of the photodetector array 500 including the photodetection elements 50 shown in FIG. 6. In FIG. 10, plural first electrodes 54 consisting of ITO which is a transparent conductive material are formed longitudinally and in parallel to one another on a transparent substrate 53. The organic films 55, 56, 57, 58 consisting of the materials shown in FIG. 6 are stacked as an as-deposited film over the plural first electrodes 54 on the substrate on which the first electrodes 54 are formed as a pattern. Second electrodes 59 which are perpendicular to the first electrodes 54 and consisting of aluminum are formed on the upper surface of the as-deposited film.

In the present embodiment, the organic films are not segmented with respect to each photodetection element, and the photodetection element is defined as a crossing region between the strip-shaped first electrode 54 and second electrode 59 in plan view. In the photodetector array realized by using the conventional silicon semiconductor, the inorganic semiconductor film constituting the elements is thick, and the conductivity thereof is further high, so that it is necessary to separate the elements from one another by forming an incision between adjacent elements. On the other hand, in the photodetection elements consisting of the organic thin film, the film thicknesses of the organic semiconductor material, the organic conductive material, and the inorganic oxide conductive material which constitute the stacked film are small, and the conductivity thereof is low, so that it is possible to electrically separate adjacent elements from each other without performing an incision therebetween. By wisely utilizing the characteristics of the organic materials as described above, the present embodiment can achieve a device structure avoiding a disadvantage that a film is prone to damage by wet or dry etching and pattern formation of a stacked film is difficult in the case of the organic material.

In the photodetector array 500 shown in FIG. 10, terminal portions 54a in which the first electrodes 54 consisting of ITO are exposed to the surface are arranged side by side at the lower portion of the substrate 53. In addition, terminal portions 59a to which the second electrodes 59 extend are arranged side by side at the left portion of the substrate 53. In order to expose the terminal portions 54a, these portions are covered with a masking tape, and after the film formation, the tape is peeled off to form the terminal portions 54a. As shown in FIG. 8, the first electrodes 54 function as individual electrodes, and the second electrodes 59 function as common electrodes.

EXAMPLES

Examples of the present invention will be specifically described according to the embodiment of the present invention described above.

(Fabrication of Photodetector Array)

The photodetector array shown in FIG. 10 was fabricated on a transparent glass substrate. A mask was prepared, in which sixteen slits each having 1 mm width were linearly formed at intervals of 2 mm, and superimposed on a glass substrate in close contact with the glass substrate, and then a film of ITO having a thickness of 50 nm was formed by sputtering from the mask surface side, thereby forming sixteen first electrodes 54. Next, in order to make the work function of the ITO surface shallow, the ITO surface was modified with PEIE (polyethyleneimine ethoxylate). PEIE was mixed with 2 methoxyethanol at a volume ratio of 1:100, and coated by spin coating to form a coating film, and then the coating film was baked at 100° C. for 60 seconds.

Next, after the connection terminal portions 54a of the first electrodes were masked with a tape, a bulk heterojunction type photoresponsive active layer of P3HT:PCBM consisting of a p-type organic semiconductor P3HT (poly-3-hexylthiophene-2,5-diyl) and an n-type organic semiconductor PCBM ([6,6]-phenyl-$C_{61}$-methyl butyrate) was formed. A film was formed by spin coating with a mixed solution obtained by individually weighing 30 mg of P3HT and 30 mg of PCBM, dissolving weighed P3HT and PCBM in 1 ml of heated chlorobenzene and removing coarse particles with a membrane filter having a pore diameter of 0.2 μm.

Next, a common anode consisting of PEDOT:PSS (poly-3,4-ethylenedioxythiophene-polystyrene sulfonic acid) was formed on the active layer consisting of P3HT:PCBM. PEDOT:PSS (Model No. CLEVIOS P VP CH 8000) purchased from Heraeus was subjected to the spin coting to form a film. The solvent of the coating solution of PEDOT:PSS is a polar solvent and does not dissolve P3HT and PCBM in a lower layer. Therefore, the stacked film can be formed by a coating method excellent in productivity without influencing the lower layer to cause deterioration. Many types of PEDOT:PSS having different conductivities are provided. However, those types which have high conductivities exceeding 1 S/cm caused a problem of elements being joined to each other. Therefore, conductive materials of 1 S/cm or less in conductivity is required. Particularly, in high definition devices, the elements could be separated and operated with materials of 0.01 S/cm or less.

An organic semiconductor film of P3HT constituting a Schottky diode is formed on the common anode. The film was formed by spin coating with a solution prepared by weighing 60 mg of P3HT, dissolving the weighed P3HT in 1 ml of heated chlorobenzene and removing coarse particles with a membrane filter having a pore size of 0.2 μm. In this film forming process, chlorobenzene does not dissolve PEDOT:PSS film, and chlorobenzene is blocked by PEDOT:PSS film, so that the film of P3HT can be formed without influencing the active layer formed under the common cathode. As described above, in the present invention, since the common cathode is insoluble in the solvent when the organic thin film diodes above and below the common cathode are coated, it is possible to adopt a film forming method having extremely high productivity which is a coating method, and it is possible to provide a photodetector array having a large area at a low price.

After the as-deposited film consisting of the above organic materials is stacked and formed, a film of aluminum electrodes is formed to form Schottky diodes, and at the same time, the second electrodes 59 are formed. As in the case of the formation of the first electrodes, the second electrodes of aluminum are formed by preparing a mask in which sixteen slits having 1 mm width are linearly formed at intervals of 2 mm linearly, superimposing the mask in close contact with a substrate 53 in a direction perpendicular to the first electrodes, and performing vapor deposition from the mask surface side. The organic diode of the present invention is resistant to oxygen and moisture to some extent, but in order to bring the organic diode with practical durability, it is preferable that a barrier layer for blocking oxygen and moisture is formed at the uppermost portion. In the present example, after the second electrodes were formed and the elements of the photodetector array were completed, an organic film of parylene (poly-para-xylene) was formed by vapor deposition. The film thickness of each layer formed by the above process is 10 nm for the PEIE layer 55, 200 nm for the P3HT:PCBM photoactive layer 56, 50 nm for the common anode 57 for PEDOT:PSS, 70 nm for the P3HT organic semiconductor film 58, and 100 nm for the second electrodes 59 of aluminum. These film thicknesses are not limited to these numerical values, and can be arbitrarily set within an optimized range in design.

(Operation of Photodetector Array)

FIG. 11 shows a state where the organic photodetector array fabricated in the manner described above is operated. The photodetector array was operated while the sixteen individual electrodes 54 and the sixteen common electrodes 59 were connected to an external control circuit (not shown) via cables. The control circuit includes a readout control circuit for applying the voltage Von and the voltage Voff to the common electrodes, a 16-channel microammeter for measuring currents flowing through the individual electrodes, and a control computer for controlling the readout control circuit and the microammeter. The readout control circuit is connected to the sixteen common electrodes to apply the voltage Von to one of the common electrodes and apply the voltage Voff to the other common electrodes. From the characteristic of the photodetector shown in FIG. 9, the voltage Von was set to −2 V and the voltage Voff was set to 0.5 V. The voltage Von and the voltage Voff are applied for a time that secures an appropriately set settling time after the photocurrent measured by the microammeter rises, and after the current measurement by the microammeter has been completed, the process shifts to a next measurement of the common electrodes. By sequentially scanning the sixteen common electrodes in this measurement process, a two-dimensional light intensity distribution can be visualized as a time variation. In FIG. 11, a shadow caused by a cotton swab inserted between the photodetector array and an illumination is detected.

Second Example

FIG. 12 shows an imaging result obtained by a device in which the photodetector array having the configuration shown in FIG. 10 is fabricated with high-definition. Sixteen first electrodes and sixteen second electrodes each having a width of 50 μm were respectively formed at intervals of 100 μm. In other words, the size of the imaging sensor of the photodetector array is 1.6 mm×1.6 mm, and the number of pixels is 16×16=256 pixels. In FIG. 12, Japanese characters for "O" and "Valley" are shown in A and B, respectively. The characters of 6-point font size can be read. As described above, according to the configuration of the present invention, it is possible to easily fabricate sensors of various specifications from a high-definition photodetector array to a large-area photodetector array.

Third Example

FIG. 13 shows an example in which the photodetector array having the configuration shown in FIG. 10 is fabricated on a flexible substrate. Since it is difficult to perform a film forming process on a flexible substrate while the flexible substrate is kept flat, film formation is performed while the flexible substrate is stacked on a rigid and flat support substrate, and then the flexible substrate is peeled off from the support substrate to be completed. In this example, a glass substrate was used as the support substrate. First, in order to facilitate peeling of the flexible photodetector array from the support substrate after the process has been completed, a fluorine-based coating film is formed on the glass substrate. In this example, surface coating was applied by using fluorine-based liquid Novec of 3M company. A transparent flexible base member is stacked on the surface coating. Although PEN (polyethylene naphthalate), PET (polyethylene terephthalate) or transparent PI (polyimide) can be used as the flexible member, this example adopted a method of depositing parylene (poly paraxylene) on the support substrate by vacuum evaporation to form the flexible member. After formation of a film of parylene, elements were formed in the same process as described above by using a substrate 53 spin-coated with a very thin layer of polyimide for surface planarization. The photodetector array shown in FIG. 13 was completed by mounting a flexible wiring for connecting an external circuit after the formation of the elements and finally peeling off from the support substrate. According to the configuration of the present invention, it is possible to form a photodetector array on a flexible base member by using the organic material that is softy and can be formed into a film by a low-temperature process. A high-performance active device in which organic rectifier diodes as switching elements and organic photodiodes as photodetection elements are integrally stacked and integrated can be manufactured with a simple structure and with high productivity.

In the above examples, the common anode which is the intermediate connection electrode layer is formed of PEDOT:PSS, but the common anode likewise operates even when it is formed of molybdenum oxide (MoOx). A film of molybdenum oxide was formed by vacuum vapor deposition. At this time, by stacking a film of molybdenum oxide at a thickness of 20 nm or more, the coating and film formation of P3HT could be performed without affecting the P3HT:PCBM layer as the lower layer. It is possible to use gold having a suitable work function for the intermediate connection electrode layer. However, when a film of gold is formed at such a thickness that barrier performance to the solvent is obtained in the coating and film formation process, the adjacent photodetection elements cannot be separated from each other if the intermediate connection electrode layer is divided between the adjacent photodetection elements because gold has extremely high electrical conductivity. Accordingly, it is preferable that an organic conductive material or a metal oxide conductive material is used for the intermediate connection electrode layer. The material of an organic-inorganic perovskite type solar cell which is based on an organic-inorganic hybrid technology is also applied to the active layer of the photoresponsive organic diode, and the carrier transporting characteristic of the organic material is applicable to the device configuration based on the energy levels of the present invention. By forming the film of the organic-inorganic perovskite type active layer by coating, a photodetector array having high photosensitivity can be realized.

According to the embodiment and the examples described above, the organic layer is not required to be patterned separately for each of photodetection elements (pixels), and a photodetector array having no crosstalk can be realized. As a result, the manufacturing process can be extremely simplified, and a high-quality high-definition imaging device can be realized by using an organic material which has been difficult to be put into practical use. Since the photodiodes and the rectifier diodes are vertically stacked in a continuous film forming process, the photodetection area of the photodiodes is not sacrificed, and the resolution of the photodetection element arrangement is not reduced. In addition, a wiring for connecting two diodes is unnecessary, and a risk of disconnection caused by bending is significantly reduced in a flexible optical sensor, so that a reliable imaging device can be provided.

INDUSTRIAL APPLICABILITY

A flexible two-dimensional optical image scanner according to the present invention can be mounted on a non-flat curved surface to realize a visual and optical imaging functions on a three-dimensional surface. As a result, the surface of an object is brought with perception of light, and proximity detection on the surface of a moving object such as a robot and continuous monitoring with light under an invisible situation can be performed.

The invention claimed is:

1. A photodetector array having a stacked film, the stacked film comprising
a plurality of first electrodes formed on a substrate and extending in parallel in a first direction,
a plurality of second electrodes extending in parallel in a second direction crossing the first electrodes,
a first organic thin film diode and a second organic thin film diode disposed between each of the first electrodes and each of the second electrodes, and
an intermediate connection electrode layer serving as a common anode or a common cathode, the intermediate connection electrode layer connecting the first organic thin film diode and the second organic thin film diode by backward-diode connection,
wherein at least either the first electrodes or the second electrodes are transparent with light passing therethrough,
the first organic thin film diode is a photoresponsive organic diode,
the second organic thin film diode is an organic rectifier diode, and
the intermediate connection electrode layer operates so that, with respect to the first organic thin film diode and the second organic thin film diode connected thereto, positive holes are transferred as the common anode and electrons are transferred as the common cathode.

2. The photodetector array of claim 1, wherein the first organic thin film diode is a heterojunction type and the second organic thin film diode is a single carrier type or Schottky type organic rectifier diode.

3. The photodetector array of claim 2, wherein the first organic thin film diode is a bulk heterojunction type photoresponsive organic diode.

4. The photodetector array of claim 1, wherein the first organic thin film diode and the second organic thin film diode have the same energy level for transporting carriers of electrons or holes transferred through the intermediate connection electrode layer are same.

5. The photodetector array of claim 3, wherein the organic semiconductor material constituting the first organic thin film diode and/or the second organic thin film diode is poly-3-hexylthiophene-2,5-diyl (P3HT) or a p-type semiconductor material having a sensitivity to light having a similar or different wavelength thereto.

6. The photodetector array of claim 4, wherein the first organic thin film diode and the second organic thin film diode are organic semiconductor materials transporting the carriers.

7. The photodetector array of claim 1, wherein the intermediate connection electrode layer is insoluble in a solvent used for forming the first or second organic thin film diode by coating means.

8. The photodetector array of claim 1, wherein the stacked film is formed through a plurality of photodetectors formed between the plurality of first electrodes and the plurality of second electrodes.

9. The photodetector array of claim 1, wherein the intermediate connection electrode layer consists of an organic conductive material or a metal oxide conductive material.

10. The photodetector array of claim 1, wherein the difference between an energy level of the highest occupied molecular orbital (HOMO) of an active layer of the first organic thin film diode and/or a semiconductor layer of the second organic thin film diode and an energy level of a work function of an intermediate connection electrode layer material is 0.5 eV or less.

11. The photodetector array of claim 1, wherein the substrate is a flexible substrate.

12. The photodetector array of claim 11, wherein the flexible substrate consists of polyethylene naphthalate (PEN), polyethylene terephthalate (PET), transparent polyimide (PI) or parylene (polyparaxylene).

13. The photodetector array of claim 1, wherein the photodetector array is formed by
  applying an active layer of a first organic thin film diode to the plurality of first electrodes formed on the substrate;
  applying the intermediate connection electrode layer on the active layer of the first organic thin film diode,
  applying a semiconductor layer of the second organic thin film diode to the intermediate connection electrode layer; and
  forming the plurality of second electrodes on the semiconductor layer of the second organic thin film diode.

14. The photodetector array of claim 1, wherein the difference between an energy level of the highest occupied molecular orbital (HOMO) of an active layer of the first organic thin film diode and/or a semiconductor layer of the second organic thin film diode and an energy level of a work function of an intermediate connection electrode layer material is 0.3 eV or less.

* * * * *